United States Patent
Cai

(10) Patent No.: US 7,531,888 B2
(45) Date of Patent: May 12, 2009

(54) INTEGRATED LATCH-UP FREE INSULATED GATE BIPOLAR TRANSISTOR

(75) Inventor: Jun Cai, Scarborough, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 165 days.

(21) Appl. No.: 11/564,948

(22) Filed: Nov. 30, 2006

(65) Prior Publication Data

US 2008/0128744 A1    Jun. 5, 2008

(51) Int. Cl.
    *H01L 29/00* (2006.01)
(52) U.S. Cl. .................. 257/556; 257/557; 257/492; 257/493; 257/E29.197
(58) Field of Classification Search ................ 257/350, 257/410, 335, 342, 491, 492, 493, 133, 119, 257/122, 147, E29.202, E29.211, E21.388, 257/E29.197, E29.027, 556, 552, 557
    See application file for complete search history.

(56) References Cited

U.S. PATENT DOCUMENTS

| | | | |
|---|---|---|---|
| 4,963,951 A | 10/1990 | Adler et al. | |
| 5,294,824 A | 3/1994 | Okada | |
| 5,378,655 A | 1/1995 | Hutchings et al. | |
| 6,049,108 A | 4/2000 | Williams et al. | |
| 6,097,063 A | 8/2000 | Fujihira | |
| 6,191,453 B1 | 2/2001 | Petruzzello et al. | |
| 6,528,849 B1 | 3/2003 | Khemka et al. | |
| 6,724,041 B2 * | 4/2004 | Rumennik et al. | 257/336 |
| 6,750,524 B2 | 6/2004 | Parthasarthy et al. | |
| 6,756,636 B2 * | 6/2004 | Onishi et al. | 257/342 |
| 6,768,171 B2 | 7/2004 | Disney | |
| 6,777,746 B2 | 8/2004 | Kitagawa et al. | |
| 6,836,001 B2 | 12/2004 | Yamauchi et al. | |
| 6,888,195 B2 | 5/2005 | Saito et al. | |
| 7,002,211 B2 | 2/2006 | Onishi et al. | |
| 7,023,050 B2 * | 4/2006 | Salama et al. | 257/341 |
| 7,105,387 B2 | 9/2006 | Minato et al. | |
| 7,115,475 B2 | 10/2006 | Yamaguchi et al. | |
| 7,126,166 B2 * | 10/2006 | Nair et al. | 257/110 |
| 7,355,224 B2 | 4/2008 | Cai | |
| 2002/0027237 A1 | 3/2002 | Onishi et al. | |

* cited by examiner

*Primary Examiner*—Evan Pert
*Assistant Examiner*—Selim Ahmed
(74) *Attorney, Agent, or Firm*—Robert D. Lott; Hiscock & Barclay, LLP

(57) ABSTRACT

A lateral Insulated Gate Bipolar Transistor (LIGBT) includes a semiconductor substrate and an anode region in the semiconductor substrate. A cathode region of a first conductivity type in the substrate is laterally spaced from the anode region, and a cathode region of a second conductivity type in the substrate is located proximate to and on a side of the cathode region of the first conductivity type opposite from the anode region. A drift region in the semiconductor substrate extends between the anode region and the cathode region of the first conductivity type. An insulated gate is operatively coupled to the cathode region of the first conductivity type and is located on a side of the cathode region of the first conductivity type opposite from the anode region. An insulating spacer overlies the cathode region of the second conductivity type. The lateral dimensions of the insulating spacer and the cathode region of the second conductivity type are substantially equal and substantially smaller than the lateral dimension of the cathode region of the first conductivity type.

27 Claims, 18 Drawing Sheets

INTEGRATED LATCH-UP FREE INSULATED GATE BIPOLAR TRANSISTOR

FILED OF THE INVENTION

This invention relates in general to semiconductor devices and more particularly to an integrated latch-up free insulated gate bipolar transistor.

BACKGROUND OF THE INVENTION

The Insulated Gate Bipolar Transistor (IGBT) is an integrated combination of a bipolar transistor and a Metal Oxide Semiconductor Field Effect Transistor (MOSFET) and has become commercially successful due to its superior on-state characteristics, reasonable switching speed, and excellent safe-operating area. The typical lateral IGBT has a gate that is located laterally between the anode and cathode. (See, e.g., U.S. Pat. No. 4,963,951, issued Oct. 16, 1990, inventors Adler et al.: U.S. Pat. No. 5,654,561. issued Aug. 5, 1997, inventor Watabe; U.S. Pat. No. 5,869,850, issued Feb. 9, 1999, inventors Endo et al.). U.S. Pat. No. 6,528,849, issued Mar. 4, 2003, inventors Khemka et al., is of interest in disclosing a super junction dual gate lateral DMOSFET device Super junction Double Diffused Metal Oxide Semiconductor (DMOS) devices are desirable because they overcome the one dimension silicon device limits for high off-state breakdown voltage and low on-state resistance. In a super junction device, depletion regions are formed in the n and p pillars for high device breakdown voltage. The relatively high doping concentration of the n pillars (for an n channel MOSFET) can reduce device on-state resistance. However, because the p pillars occupy a significant percentage of the device drift area, they do not contribute to reducing device resistance in the on-state in MOSFETS. It would be desirable to have the super junction device designed so that the p pillars make a contribution to reduce the on-state device resistance (Ron).

Lateral IGBTs (LIGBTs) are commonly used power devices for Power Integrated Circuit (PIC) applications because of their superior device characteristics. However, device latch-up, which leads to loss of gate control, may occur at high current due to the existence of the parasitic thyristor (n+ cathode/p-body/n-drift/p+ anode) in IGBT architecture. It therefore is desirable to make a virtually latch-up free IGBT.

There is thus a need for a lateral IGBT device that has reduced on-state resistance and the parasitic npn of the device is never turned on in normal operation, and therefore the lateral IGBT device is effectively latch-up free.

SUMMARY OF THE INVENTION

According to the present invention, there is provided a fulfillment of the needs and a solution to the problems discussed above.

According to a feature of the present invention, there is provided a lateral insulated gate bipolar transistor (LIGBT) device, comprising:

a semiconductor substrate;

an anode region in said semiconductor substrate;

a cathode region of a first conductivity type in said substrate laterally spaced from said anode region;

a cathode region of a second conductivity type in said substrate located proximate to and on a side of said cathode region of said first conductivity type opposite from said anode region;

a drift region in said semiconductor substrate between said anode region and said cathode region of said first conductivity type;

an insulated gate operatively coupled to said cathode region of said first conductivity type located on a side of said cathode region of said first conductivity type opposite from said anode region; and an insulating spacer overlying said cathode region of said second conductivity type;

wherein the lateral dimensions of said insulating spacer and said cathode region of said second conductivity type are substantially equal.

According to another feature of the present invention there is provided a lateral insulated gate bipolar transistor (LIGBT) device, comprising:

a p substrate;

an n region formed on said p substrate;

a p body region formed in said n region;

an anode region;

a p+ cathode region formed in said p body region laterally spaced from said anode region;

an n+ cathode region formed in said p body region located proximate to and on a side of said p+ cathode region opposite from said anode region;

a conductive layer formed on said p+ cathode region and coupled to said n+ cathode region;

a drift region formed on said p substrate between said anode region and said p+ cathode region;

an insulated gate operatively coupled to said p+ cathode region located on a side of said p+ cathode region opposite from said anode region; and an insulating spacer overlying said n+ cathode region;

wherein the lateral dimensions of said insulating spacer and said n+ cathode region are substantially equal and substantially smaller than the lateral dimension of said p+ cathode region According to still another feature of the present invention there is provided a process for making a lateral insulated gate bipolar transistor (LIGBT) device by:

forming an anode region in an active region of a semiconductor substrate;

forming a cathode region of a first conductivity type in said active region laterally spaced from said anode region;

forming a cathode region of a second conductivity type in said active region located proximate to and on a side of said cathode region of said first conductivity type opposite from said anode region;

forming a drift region in said active region between said anode region and said cathode region of said first conductivity type;

forming an insulated gate operatively coupled to said cathode region of said first conductivity type and located on a side of said cathode region of said first conductivity type opposite from said anode region; and forming an insulating spacer overlying said cathode region of said second conductivity type;

wherein the lateral dimensions of said insulating spacer and said cathode region of said second conductivity type are substantially equal.

DESCRIPTION OF THE DRAWINGS

The aforementioned and other features, characteristics, advantages, and the invention in general will be better understood from the following more detailed description taken in conjunction with the accompanying drawings, in which.

Figure 1A:
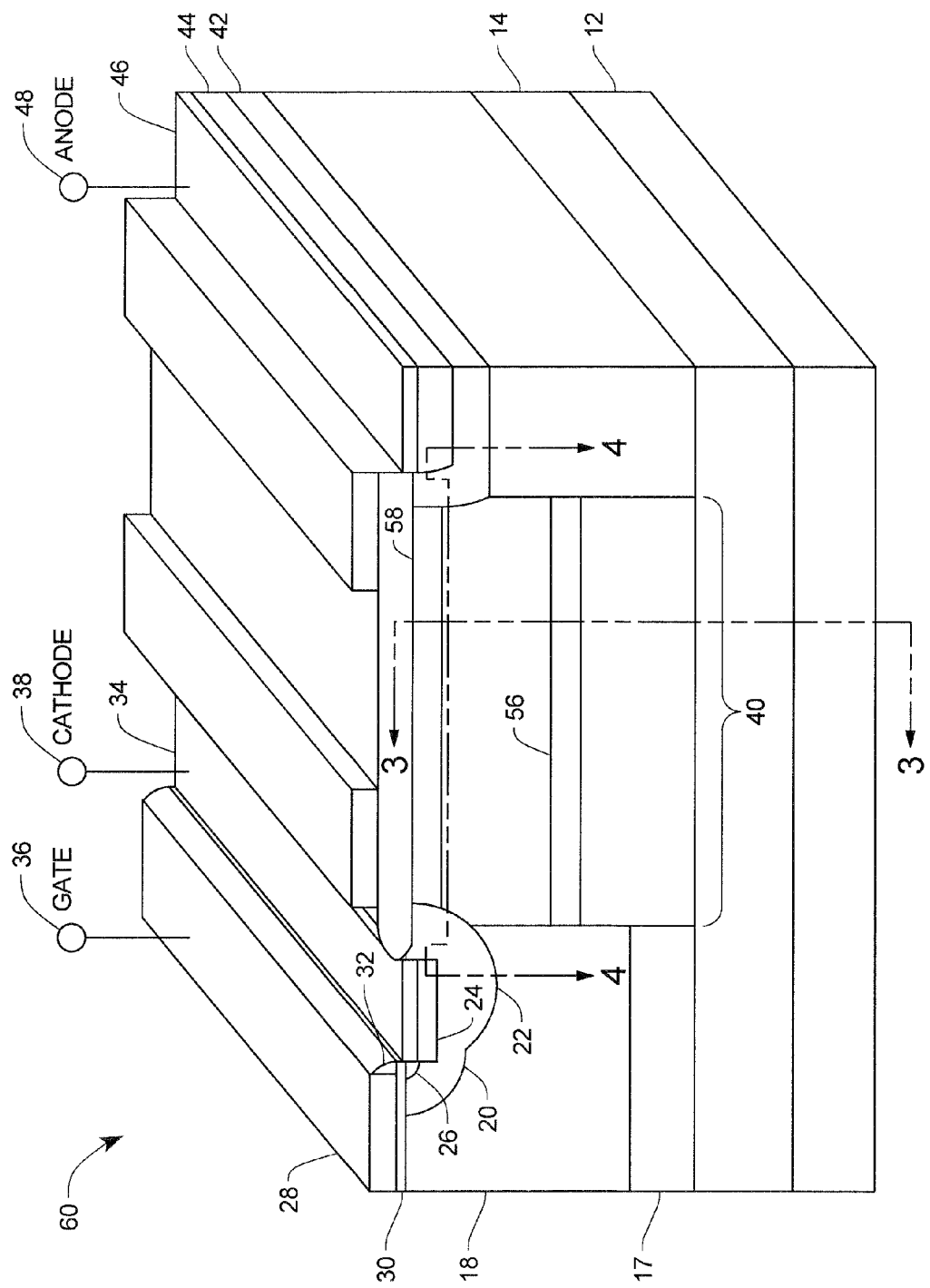
FIG. 1A is a perspective, diagrammatic view showing an embodiment of the present invention.

It will be appreciated that for purposes of clarity and where deemed appropriate, reference numeral have been repeated in the figures to indicate corresponding features. Also, the relative size of various objects in the drawings has in some cases been distorted to more clearly show the invention.

DESCRIPTION OF THE INVENTION

Referring now to FIG. 1, there is shown an embodiment 10 of a LIGBT device according to the present invention. As shown, the LIGBT device 10 includes a p– substrate 12 with an optional oxide layer 14 on top of the substrate 12. The LIGBT device 10 also includes a buried n well region 16, an n– epi region 18, a p body 20, a p– well 22, a p+ cathode layer 24, an n+ cathode spacer 26, a gate 28, a gate oxide 30, an oxide spacer 32, a cathode silicide layer 34, a gate terminal 36, a cathode terminal 38, a super junction drift region 40, an n well region 42, a p+ anode 44, an anode silicide layer 46, and an anode terminal 48. As can be seen in FIG. 1A the gate 28 is offset from the region between the cathode 34 and the anode 46. As explained in more detail below, the offset gate along with the n+ cathode spacer 26 and the p regions 20, 22, 24, and the tiny n+ cathode spacer 26 underneath the oxide spacer 32 greatly reduce the latch-up susceptibility of the LIGBT device 10.

Figure 1B:
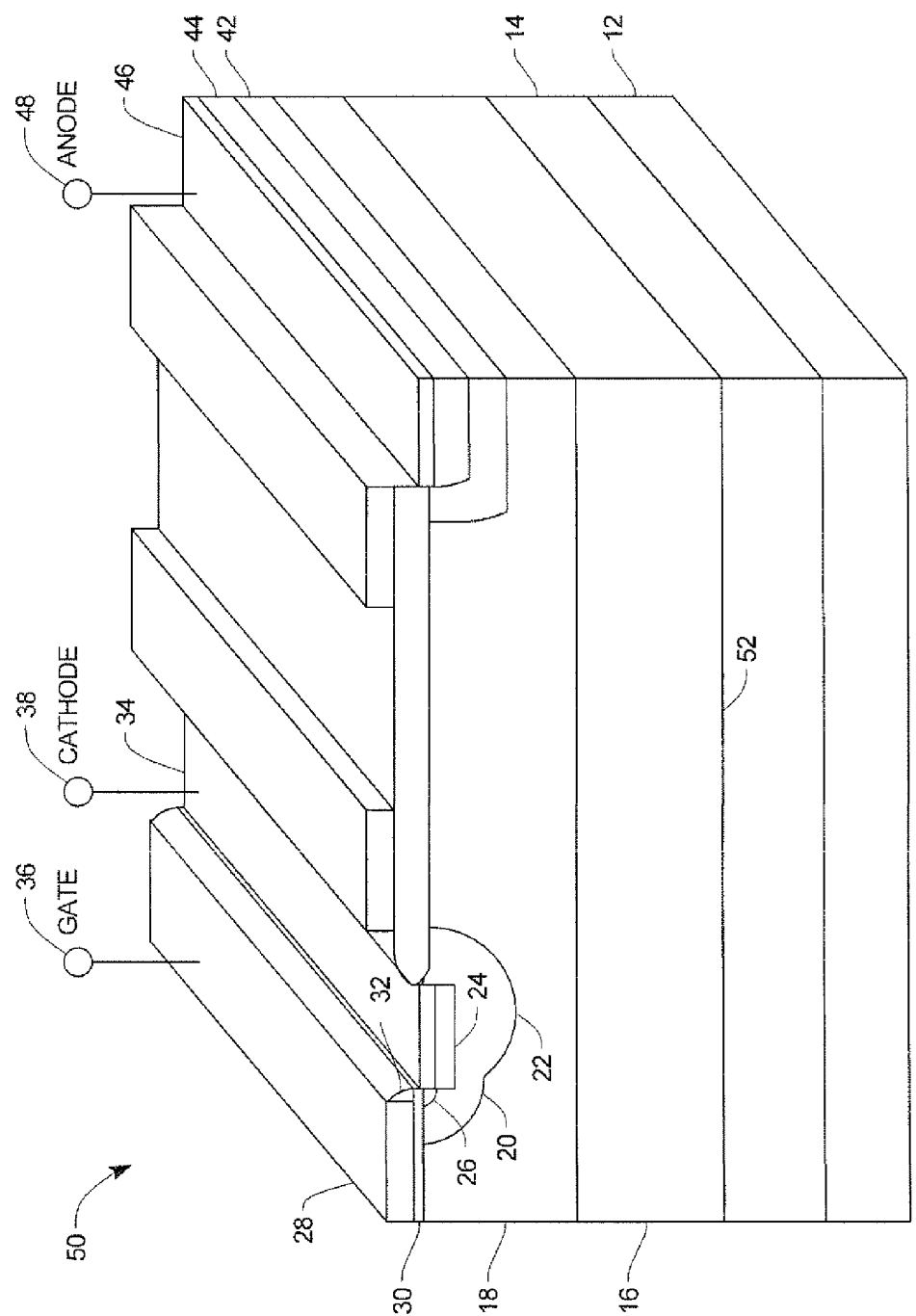
FIG. 1B is a perspective, diagrammatic view showing another embodiment of the present invention.

FIG. 1B is a perspective, diagrammatic view showing another embodiment 50 of the present invention in which the super junction drift region 40 has been replaced with a conventional RESURF drift region 52 which consists of the buried n well 16 and part of the n– epi region 18.

Figure 1C:
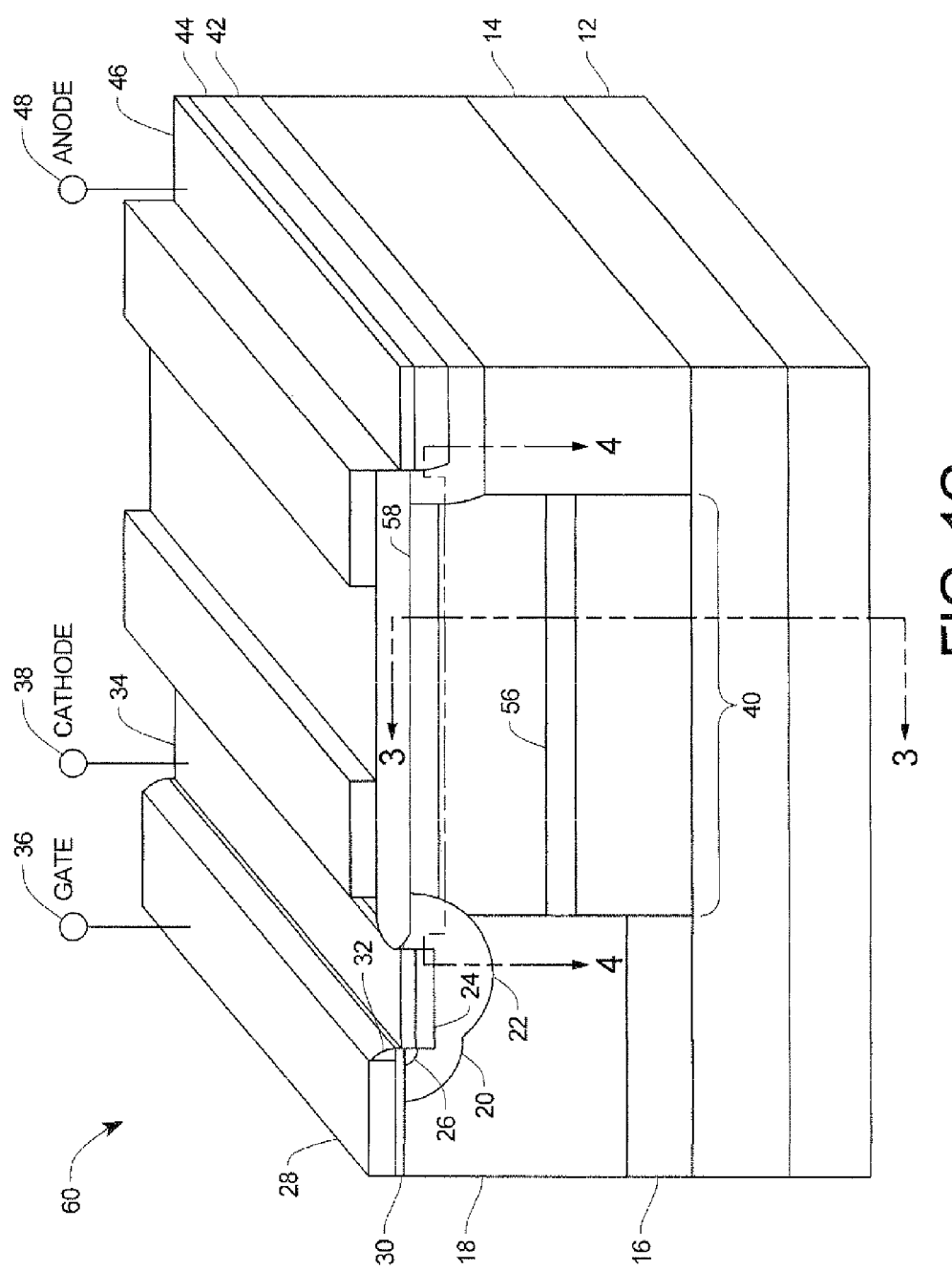
FIG. 1C is a perspective, diagrammatic view showing another embodiment of the present invention.

FIG. 1C is a perspective diagrammatic view showing another embodiment 60 of the present invention in which the buried n well region 16 has been replaced with a buried p well region 17 which can make n pillars easily depleted in the device off-state for higher device breakdown voltage, but with more current crowded in the n– epi 18 under the p regions 20, 22 inducing a little bit higher on-state resistance when compared to FIG. 1A.

Figure 2:
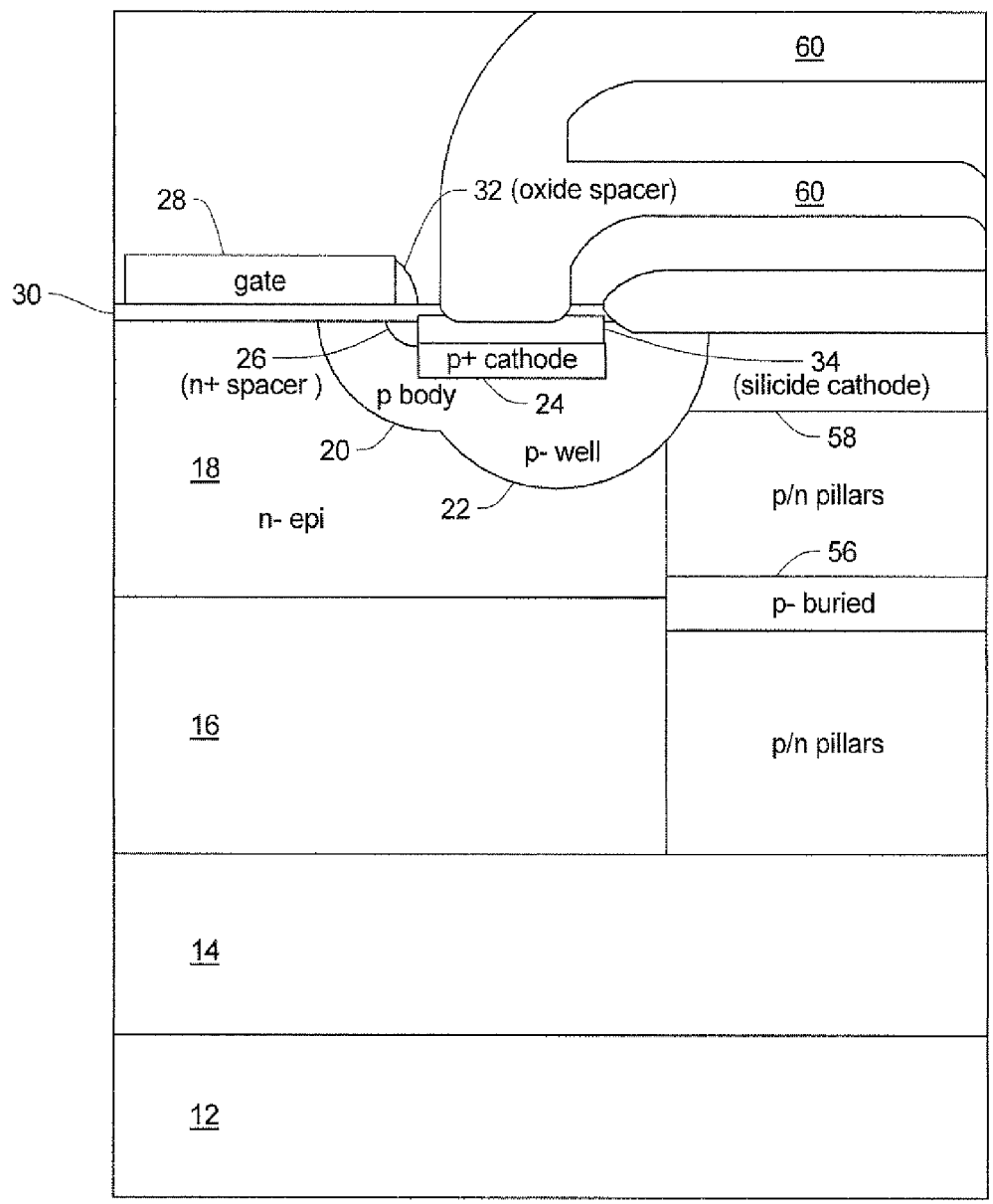
FIG. 2 is a sectional diagrammatic view showing a portion of the embodiment of FIG. 1.

FIG. 2 is an enlarged view of the upper left hand corner of FIG. 1A to better show the offset gate 28, the silicide cathode 34, the p body 20, the p– well 22, the p+ cathode layer 24, and the n+ cathode spacer 26 along with first and second metal layers 60. In the on-state the existence of the p body 20 and the p– well 22 facilitate the collection of holes by the p+ cathode layer 24 so that holes will have less tendency to flow through the area of the n+ cathode 26 which might otherwise cause device latch-up. The depletion region underneath the n+ cathode spacer 26 can also divert hole flow away from that region and reduces the number of holes that flow underneath the n+ cathode 26. All of these allow the holes to be collected effectively by the p+ cathode 24 through the p body 20 and p– well 22 before reaching the n+ cathode 26. Latch-up of device 10 is thereby effectively prevented during normal operation of the LIGBT device 10.

To further improve the latch-up characteristics the width of the n+ cathode spacer 26 is minimized. Preferably the lateral dimension of the n+ cathode region 26 is substantially smaller than the lateral dimension of the p+ cathode layer 24. In the conventional process of forming an n+ cathode region the width is limited by the photolithography capability. As discussed below with respect to FIGS. 15A, 15B, and 15C the oxide spacer 32 is used as a hard mask to define the width of the n+ cathode spacer 26.

Figure 3:
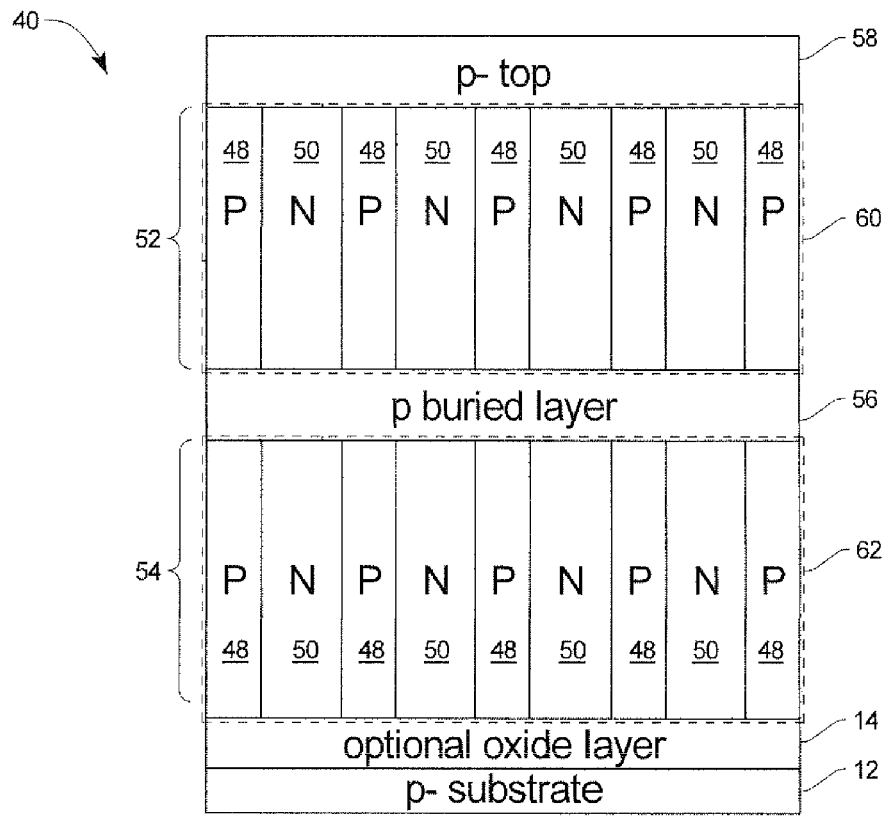
FIGS. 3 and 4 are respective cross-sectional side and top diagrammatic views showing a portion of the embodiment of FIG. 1.
Figure 4:
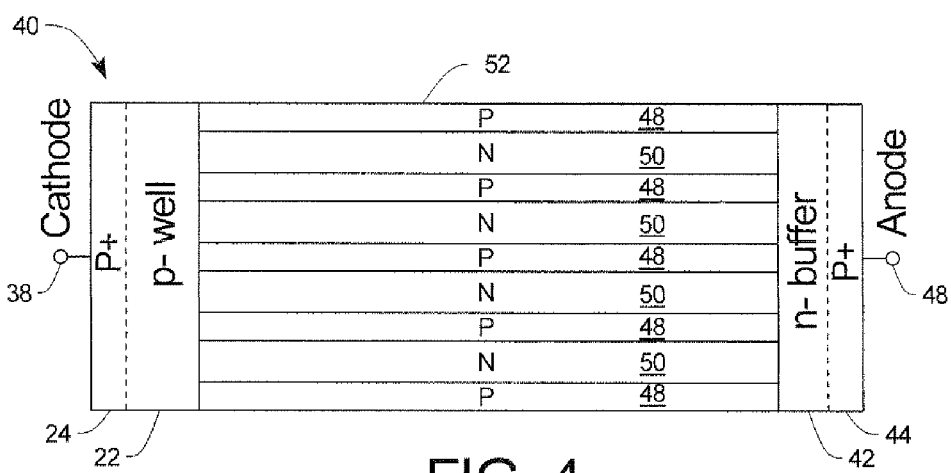

As diagrammatically shown in FIGS. 3 and 4, the super junction drift region 40 may be formed from one or more interleaved p and n pillars 48 and 50, respectively, separated into two vertical sections 52 and 54 by a p– buried layer 56. The upper section 52 has a p– top layer 58, and the lower section 54 has a bottom layer of the oxide 14 in the embodiment shown in FIG. 1A. The interleaved p and n pillars 48, 50 form multiple, stacked Junction Field Effect Transistors (JFETs) 60, 62 in the top section 52 and the bottom section 54, respectively.

When the LIGBT device 10 is in the forward conduction mode of operation when a positive voltage is applied to the p+ anode 46 relative to the p+ cathode layer 24, when the voltage applied to the gate 28 is higher than the device threshold voltage, and when an anode voltage is higher than one diode drop with respect to the cathode voltage. Under these conditions, the p+ anode 44 pn junction injects holes into the n-pillars 50 and the p-pillars 48 of the super junction drift region 40. Some of these holes will recombine with the electrons flowing in from the device channel in the n pillar regions 50 and modulate the conductivity in the n pillars 50 to reduce the n pillar resistance of the LIGBT device 10. Some of the holes will flow through p pillars 48, which cause the p pillars 48 to also make a contribution in reducing device resistance during the on-state of the LIGBT device 10. Almost all of the holes will flow from the super junction drift region 40 (from both the n and the p pillars 50, 48) to the p body 20 and the p-well 22 and be collected by the p+ cathode layer 24 without flowing through the area of the n+ cathode spacer 26. Thus, in normal operation of device 10 the holes do not cause latch-up of device 10.

When the LIGBT device 10 is reverse biased, the LIGBT device 10 operates like a conventional super junction device. In the super junction drift region 40, depletion starts at the lateral pn junctions at the cathode and anode ends of the n and p pillars 50, 48. All of the n and p pillars can be fully depleted to achieve a high device breakdown voltage.

Figure 5A:
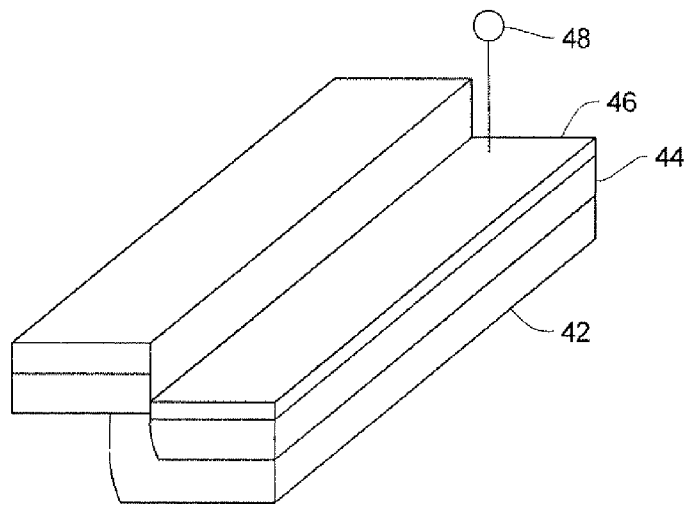
FIGS. 5A, 5B, 5C, and 5D are respective perspective diagrammatic views showing alternative anode region designs for the embodiment of FIG. 1.
Figure 5B:
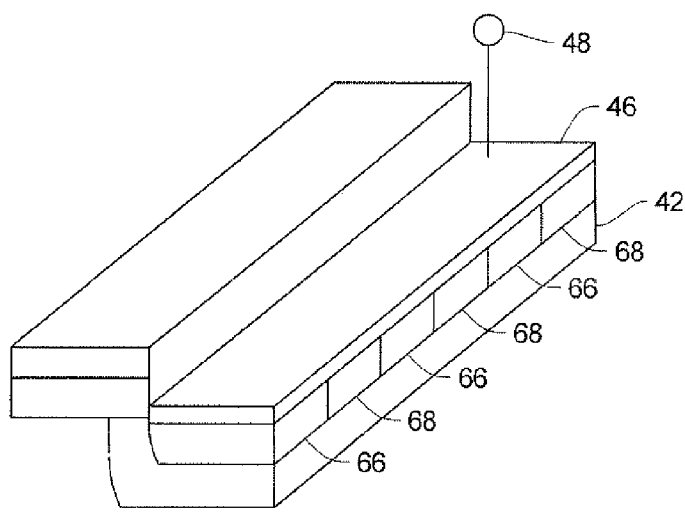
Figure 5C:
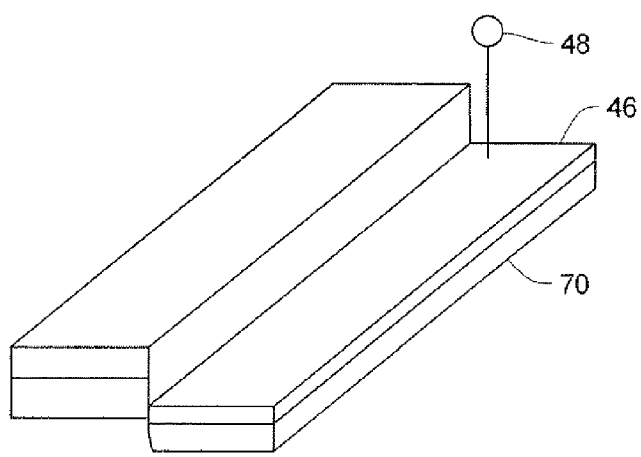
Figure 5D:
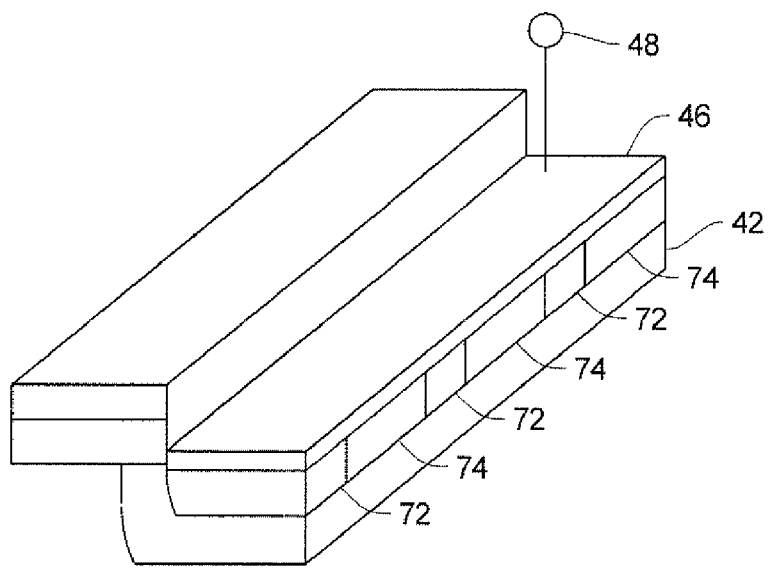

FIGS. 5A, 5B, 5C, and 5D show optional anode region designs. FIG. 5A shows the design used in the embodiment of FIG. 1 and includes a p+ anode 44, n– well region 42, conductive silicide layer 46 and anode terminal 48. FIG. 5B shows an anode design which includes interleaved n+ anode segments 66 and p+ anode segments 68. FIG. 5C shows a silicided Schottky anode (which can also be segmented) including silicide layer 46 and n− type layer 70. FIG. 5D shows the same anode region as FIG. 5B except that the n+ segments 74 have a larger cross-sectional area than the p+ segments 72.

The anode design of FIG. 5A produces the most hole injection of the four anode region designs. The hole injection modulates the conductivity of the super junction drift region 40 and provides the lowest on-state resistance. The anode design of FIG. 5B has n+ and p+ regions 66 and 68, respectively, of equal cross sectional area and provides faster switching and a higher breakdown voltage of the anode design of FIG. 5A. The anode design of FIG. 5C provides a faster switching than the anode region of FIG. 5A. The anode region of FIG. 5D, in which the area of the n+ segments 74 are 50% larger than the area of the p+ segments 72, has faster switching than the anode region of FIG. 5C.

Figure 6:
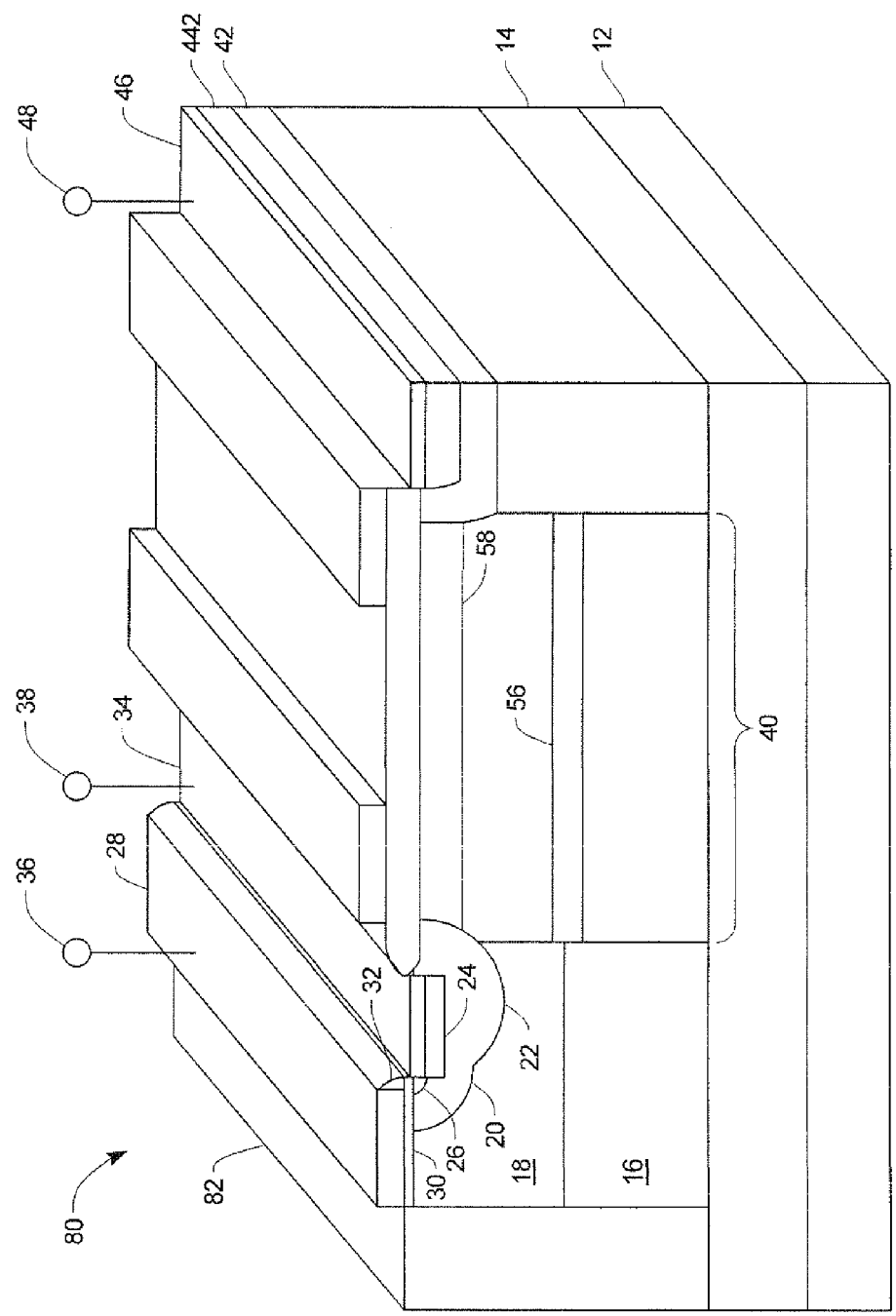
FIG. 6 is a perspective diagrammatic view of another embodiment of the present invention.

FIG. 6 shows a deep trench isolation design 80 with an SOI substrate 14 and deep trench isolation 82 that provides the best isolation but which is more expensive. An alternate substrate design is a p− substrate with p buried well and p+ sink isolation. The latter design offers less perfect isolation but is more economical.

Figure 7:
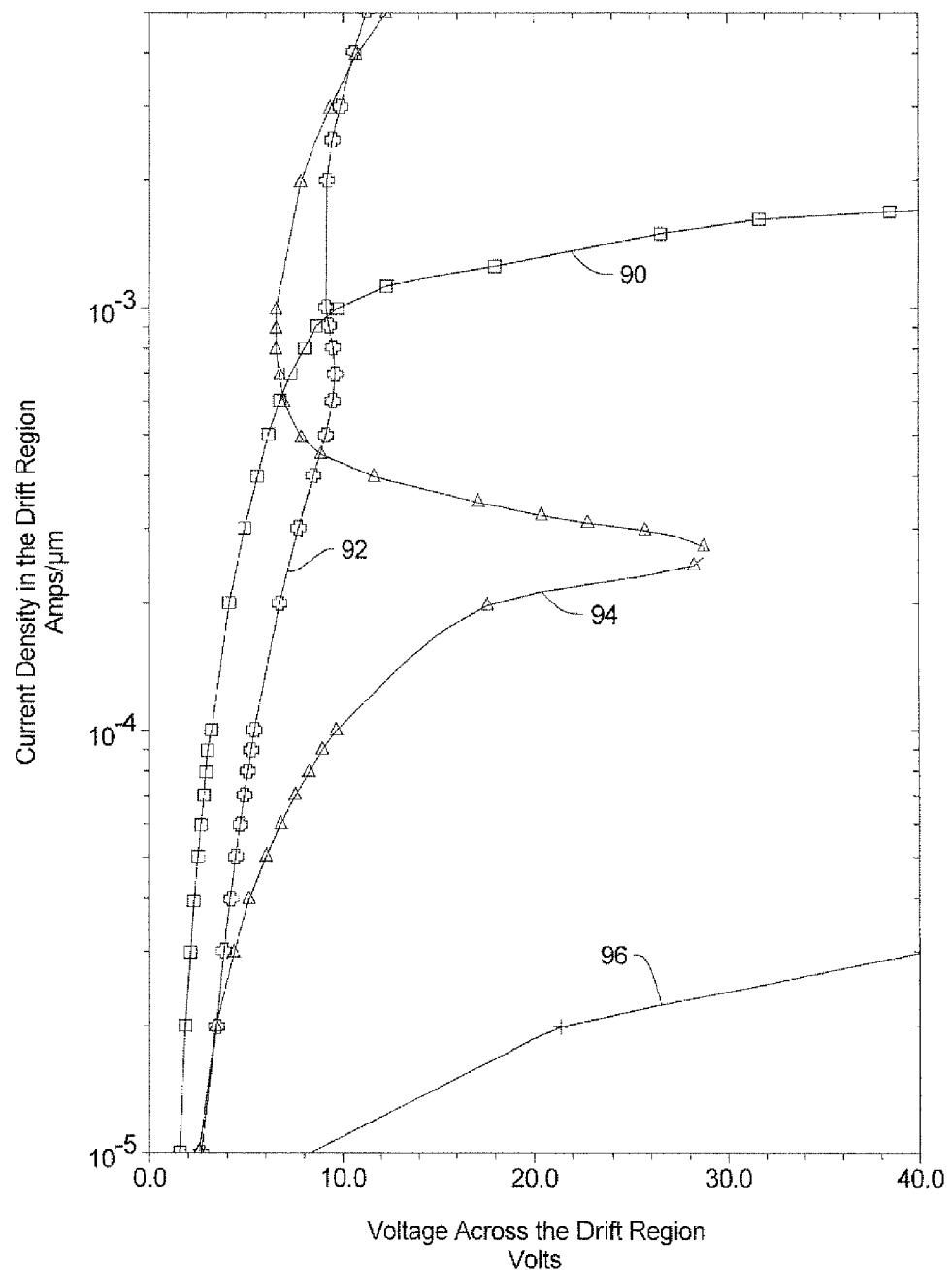
FIG. 7 is a graphical view showing forward conduction characteristics of three LIGBT devices and a LDMOS device.

FIG. 7 is a simulated graphical view showing simulated forward conduction characteristics of three LIGBT devices and a LDMOS device having similar doping profiles and a drift length of 70 μm. Curve 90 shows the current-voltage forward conduction characteristics of an off-set gate LIGBT with n+ cathode spacer according to the invention; curve 92 shows the current-voltage forward conduction characteristics of an off-set gate with 1.5 μm n+ cathode; curve 94 shows the current-voltage forward conduction characteristics of a conventional LIGBT; and curve 96 shows the current-voltage forward conduction characteristics of a conventional LDMOS. The LDMOS (curve 96) has a much lower current handling capability as compared to the LIGBT devices, but is latch-up free. This is due to the lack of conductivity modulation in the LDMOS drift region, and the lack of a parasitic thyristor structure in the device.

It is to be noted that the static latch-up current densities of the conventional LIGBT (curve 94) and the off-set gate LIGBT with an n+ cathode length of 1.5 μm (curve 92) are approximately 3e-4 A/μm and over 7e-4 A/μm, respectively. However, more importantly, effectively no latch-up occurs in the off-set gate LIGBT with the n+ cathode spacer according to the present invention (curve 90), even when the forward current density is greater than 1.7e3 A/μm, which exceeds the Si limitation for 600V-700V devices. Thus the off-set gate LIGBT with an n+ cathode spacer of the present invention has very high current handling capability and is also effectively free of latch-up.

Figure 8:
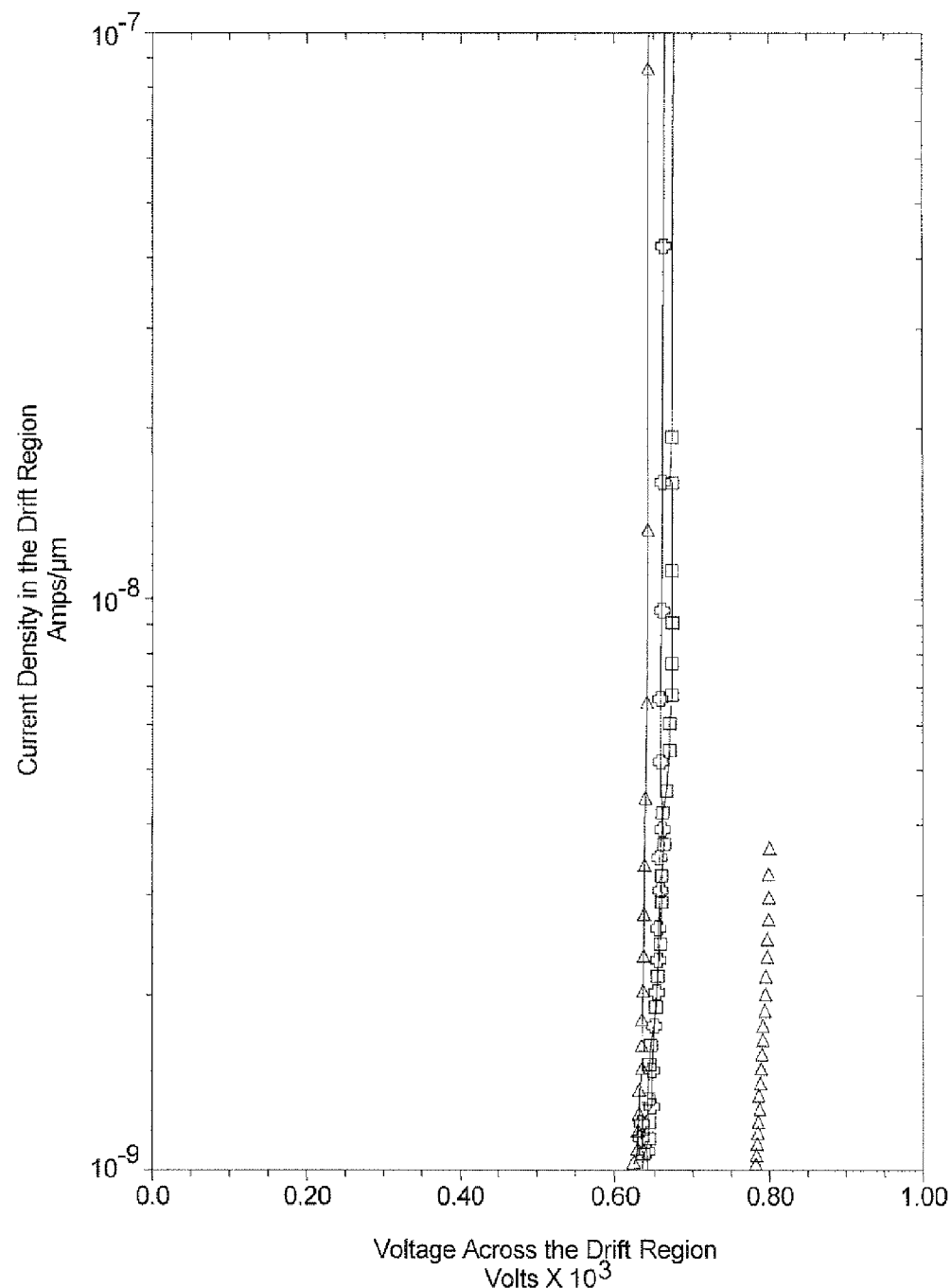
FIG. 8 is a graphical view showing reverse bias characteristics of the devices of FIG. 8.

FIG. 8 shows the simulated reversed bias characteristics of the devices shown in FIG. 7. With a similar doping profile and the same drift length of 70 μm, the simulated breakdown voltage of the three LIGBTs tested in FIG. 7 is approximately 640V, about 130V lower when compared to the LDMOS breakdown voltage of 770V. This is due to a parasitic pnp existing in LIGBT devices that can easily induce a leakage when the anode voltage is very high. The breakdown voltage of LIGBT devices can be increased by optimizing the n-buffer layer (located in the p+ anode area) to reduce the parasitic pnp beta. However, this needs to be traded off with process cost because one more buffer mask layer is needed.

Figure 9:
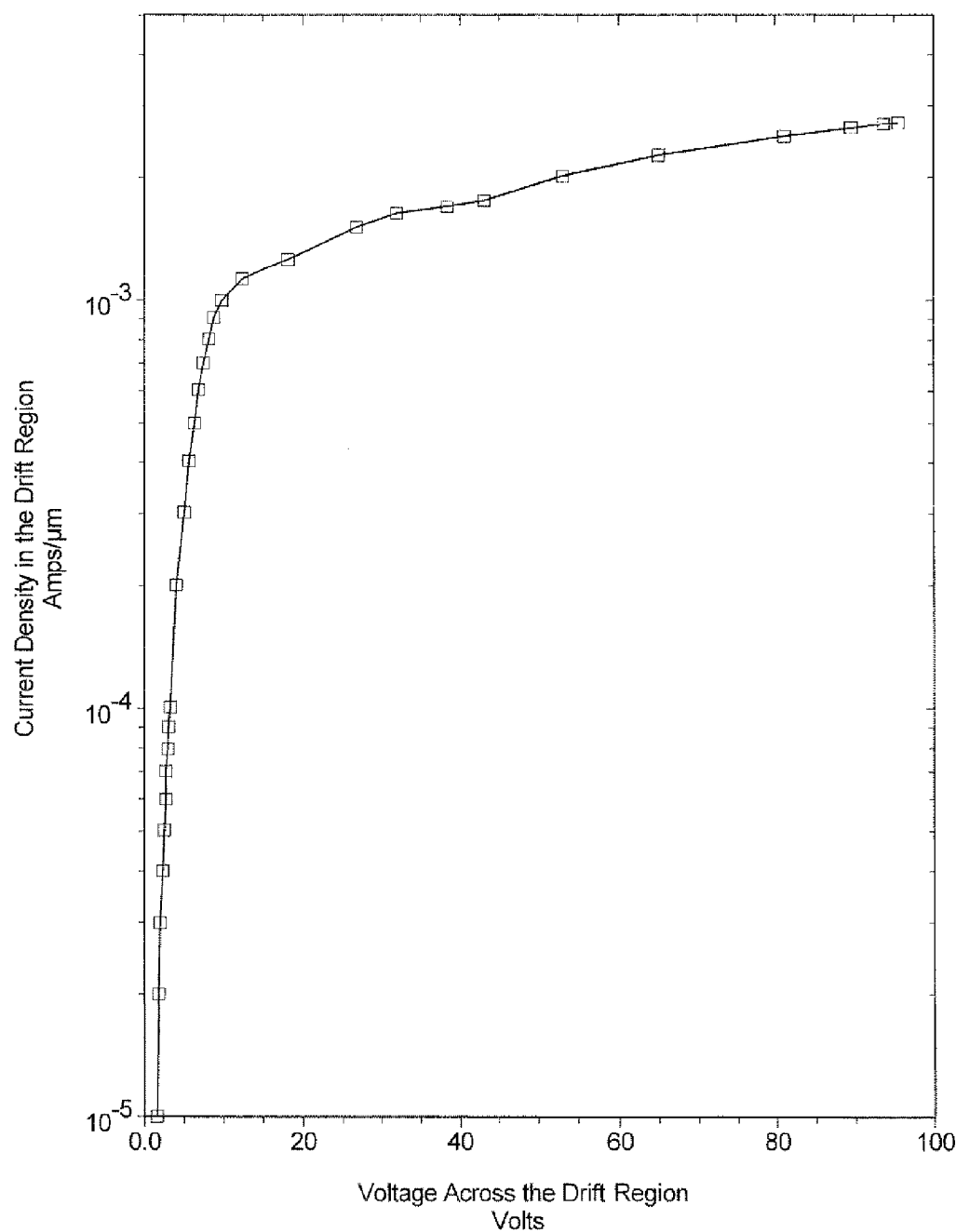
FIG. 9 is a graphical view showing the forward conduction characteristics of the present invention.

FIG. 9 shows the simulated forward conduction characteristics of the present invention with expanded current density and voltage ranges. As shown, no latch-up occurs even though the forward current density is greater than 2.8e-3 A/μm, which exceeds the Si limitation for 600V-700V devices. Thus, the offset gate LIGBT with n+ cathode spacer of the present invention has very high current handling capability and is also effectively latch-up free.

Figures 10A, 10B:
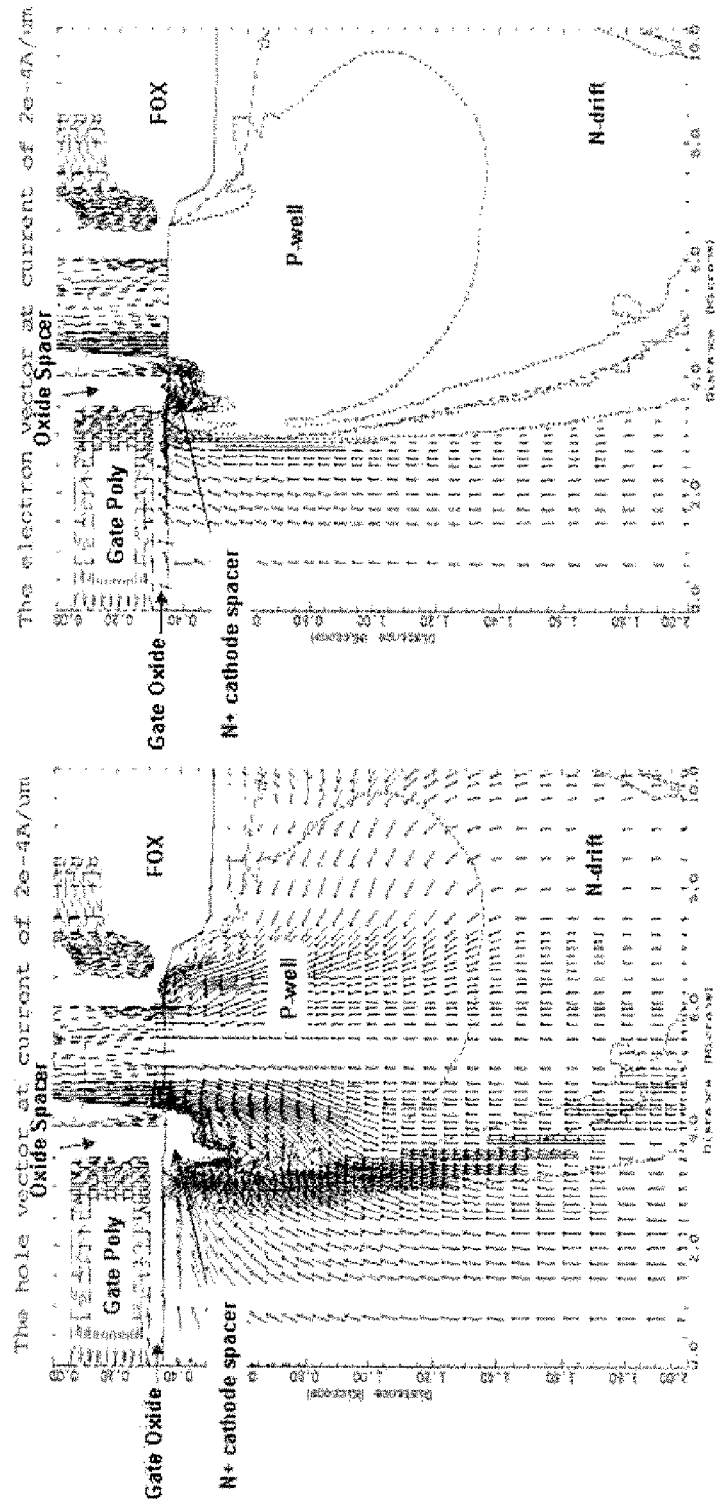
FIGS. 10A, 10B 11A, 11B, 12A, 12B, 13A, 13B, 14A, and 14B are graphical views of hole vectors and electron vectors useful in explaining the operation of the present invention.
Figures 11A, 11B:
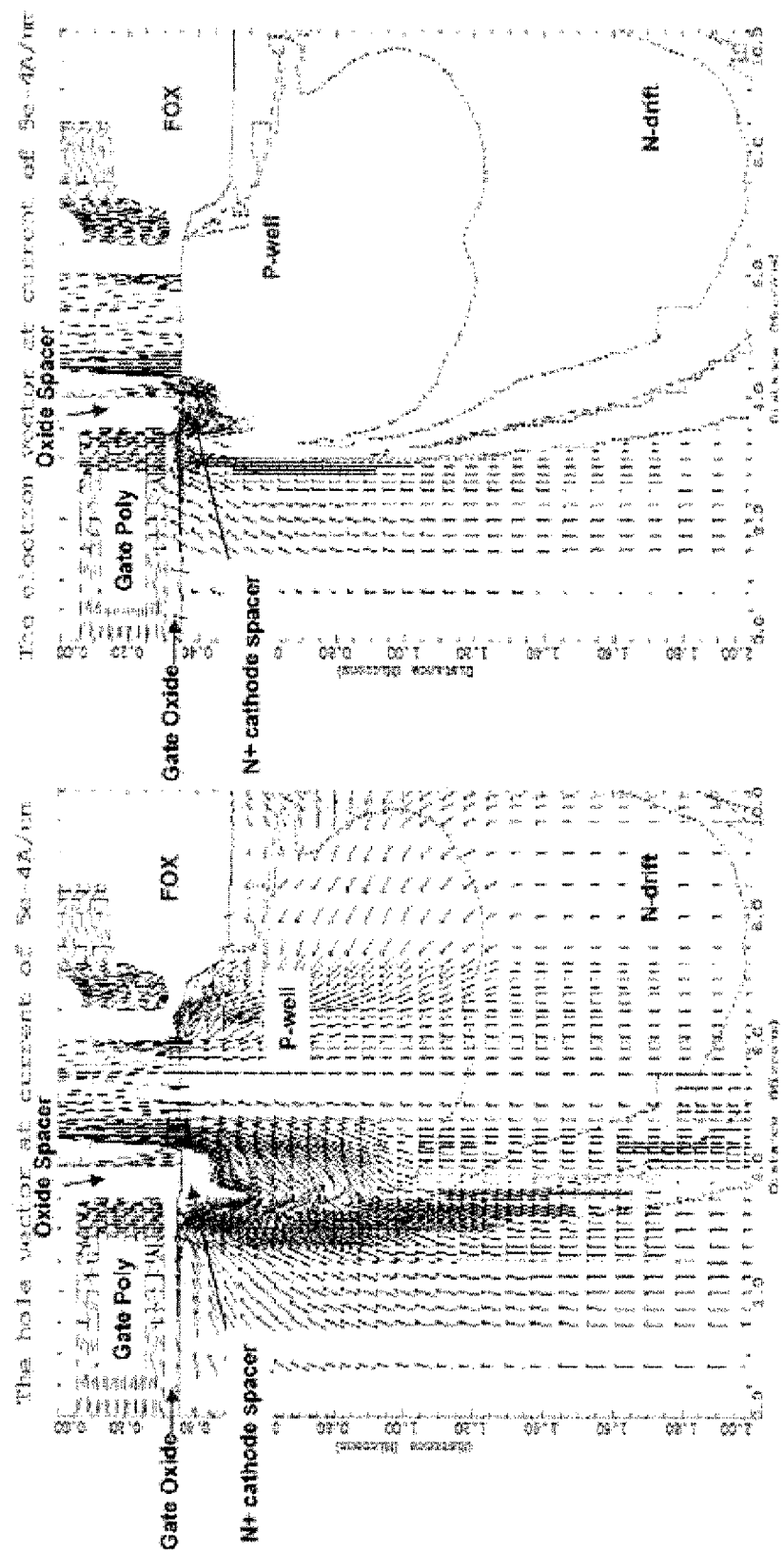
Figures 12A, 12B:
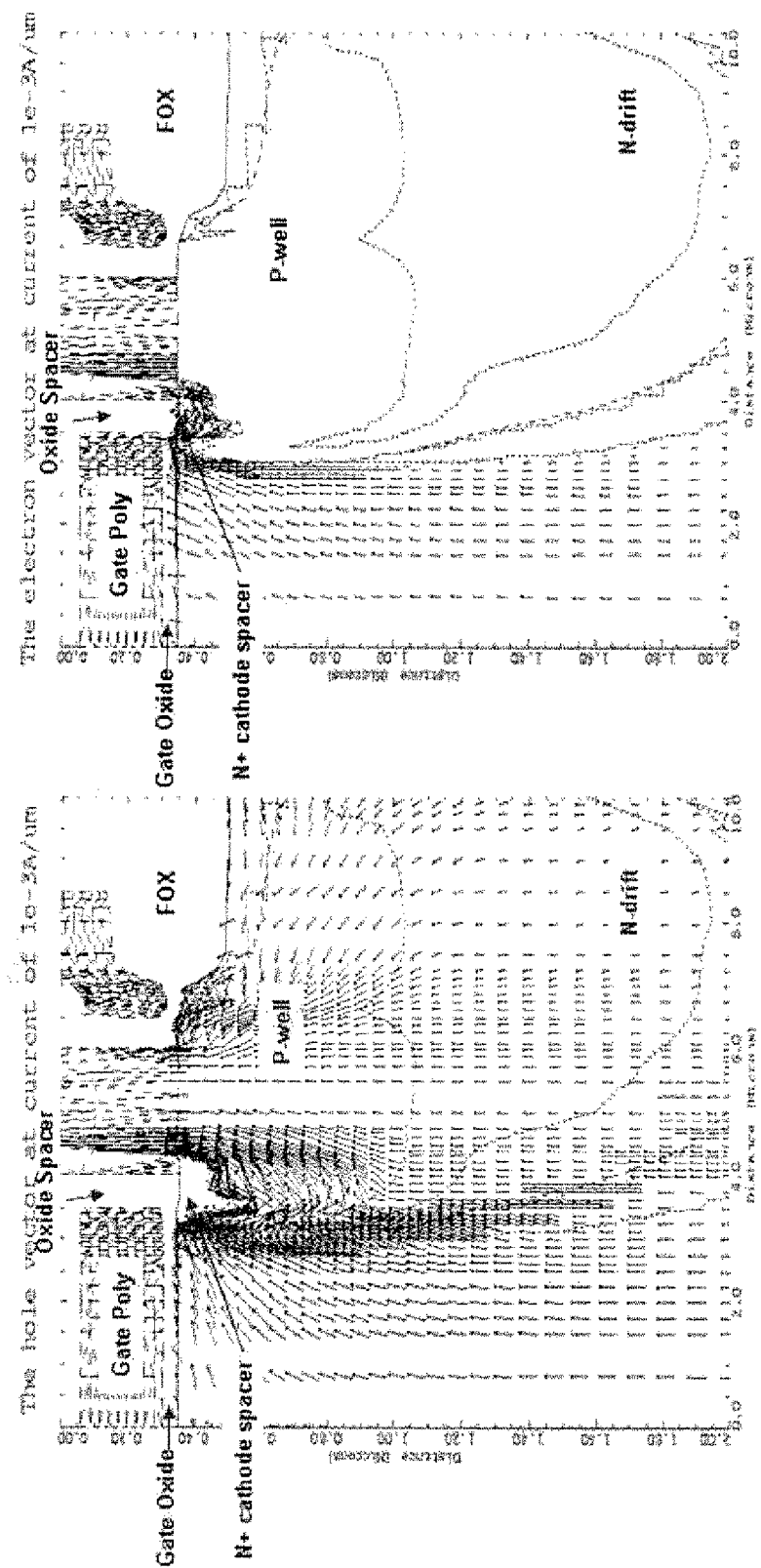

FIGS. 10A, 10B to 14A, 14B are simulated graphical views closer to the cathode and the gate area showing numerical analysis of latch-up useful in explaining the present invention. FIGS. 10A, 11A and 12A show hole vectors in the cathode region of the LIGHT of the present invention at current of 2e-4 A/μm, 5e-4 A/μm, and 1e-3 A/μm, respectively. It will be noted that no hole vectors are found at the n+ cathode spacer even at a current of 1e-3 A/μm, meaning that the n+ cathode/p-well diode did not turn on, with the result that no latch-up occurred. FIGS. 10B, 11B, and 12B show electron vectors at currents of 2e-4 A/μm, 5e-4 A/μm, and 1e-3 A/μm, respectively.

Figures 13A, 13B:
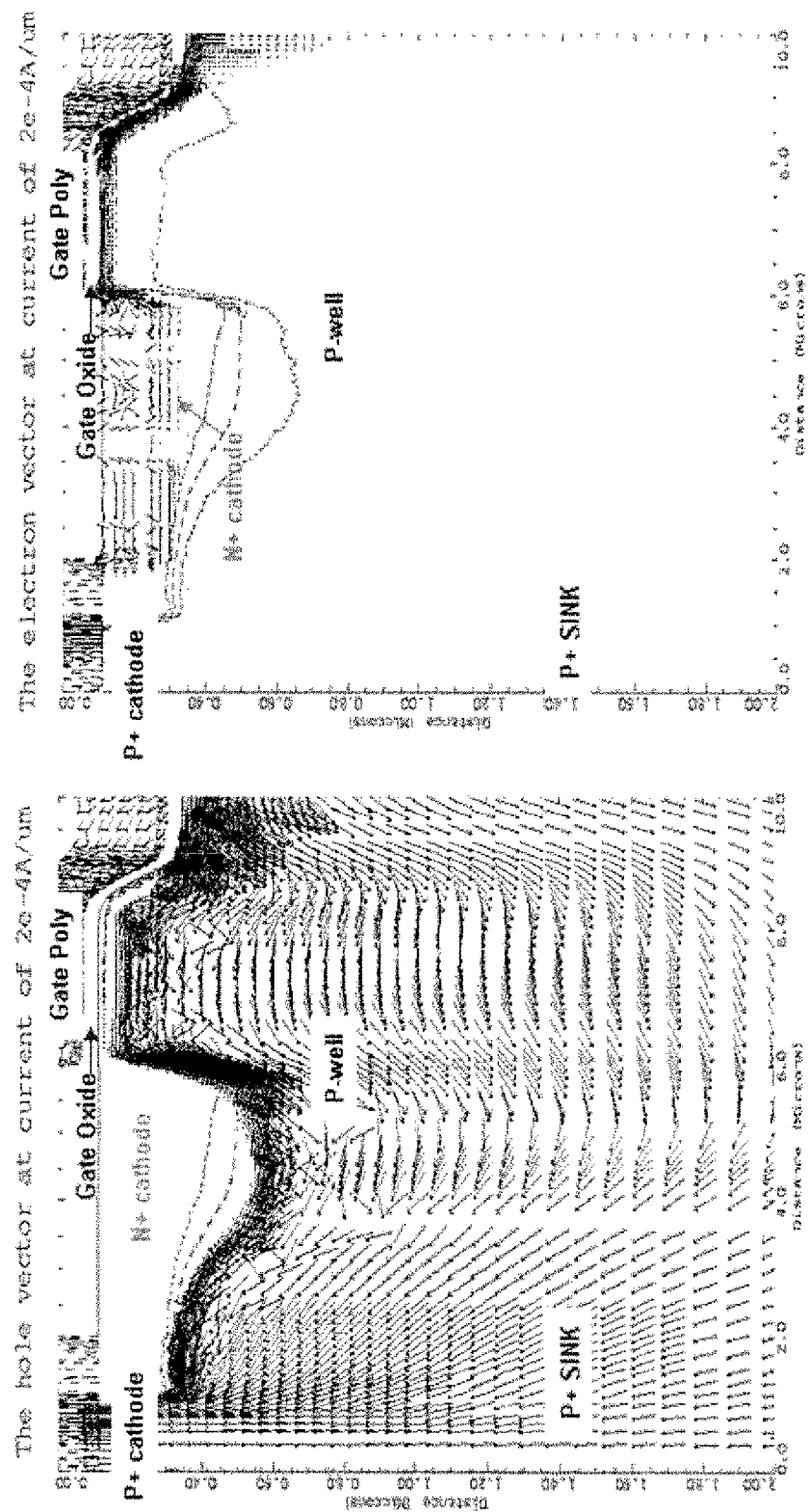
Figures 14A, 14B:
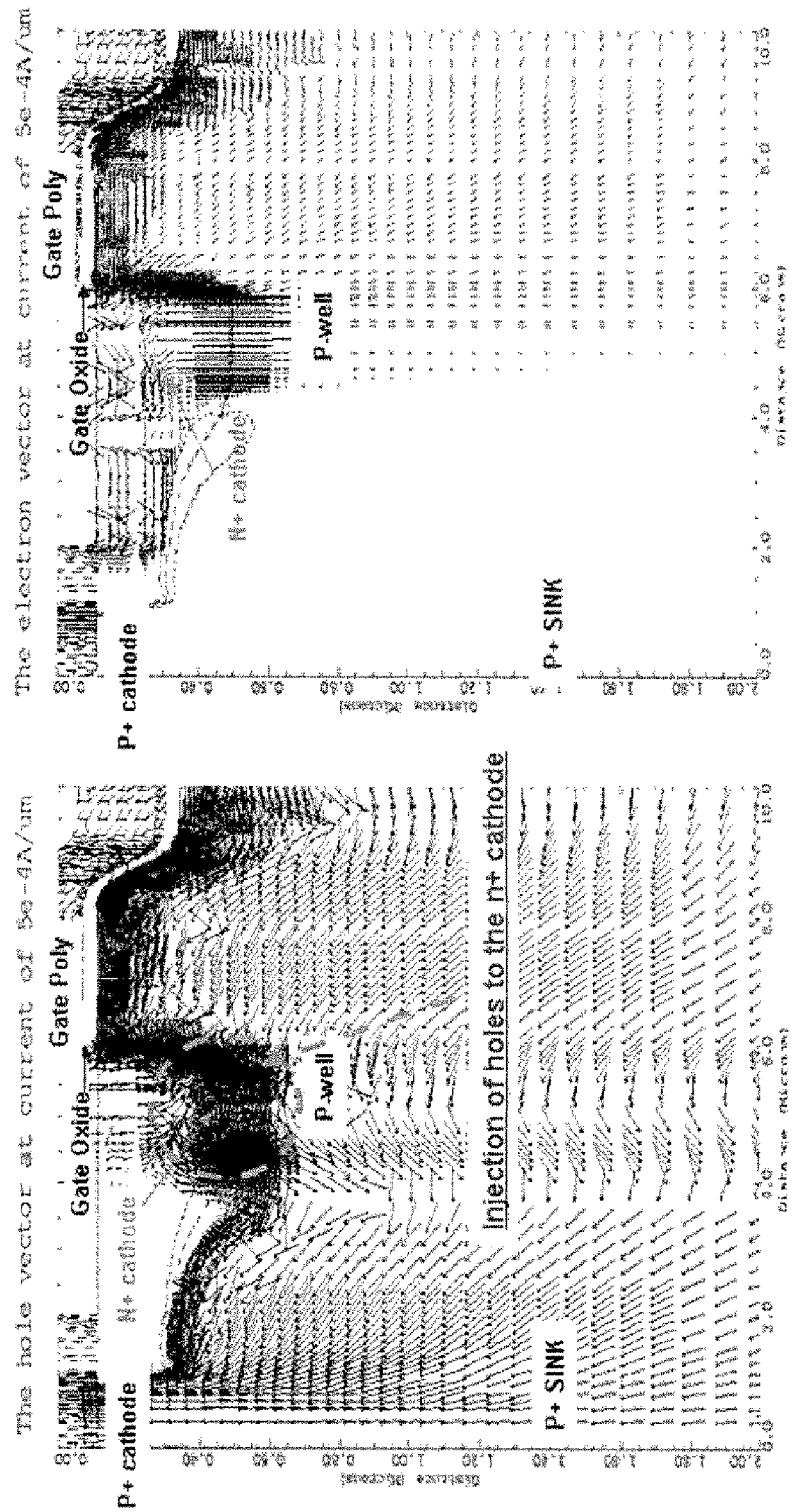

FIGS. 13A and 13B show respective hole and electron vectors in a conventional LIGBT structure at a current of 2e-4 A/μm. No hole vectors are found in the n+ cathode area, meaning that the n+ cathode/p-well diode did not turn on at that current and no latch-up occurred. FIGS. 14A and 14B show respective hole and electron vectors in a conventional LIGBT structure at a current of 5e-4 A/μm. Injection of holes to the n+ cathode is obvious at a current of 5e-4 A/μm, meaning that the n+ cathode/p− well diode did turn on and latch-up occurred.

Figure 15A:
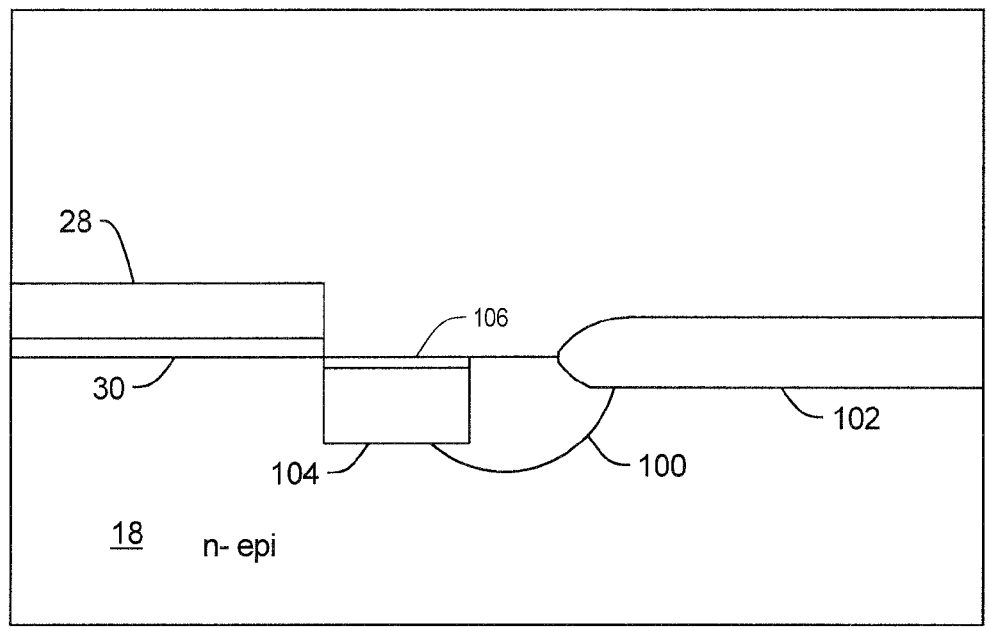
FIGS. 15A, 15B, and 15C are sectional diagrammatic views showing the forming of the n+ cathode spacer shown in FIG. 1.
Figure 15B:
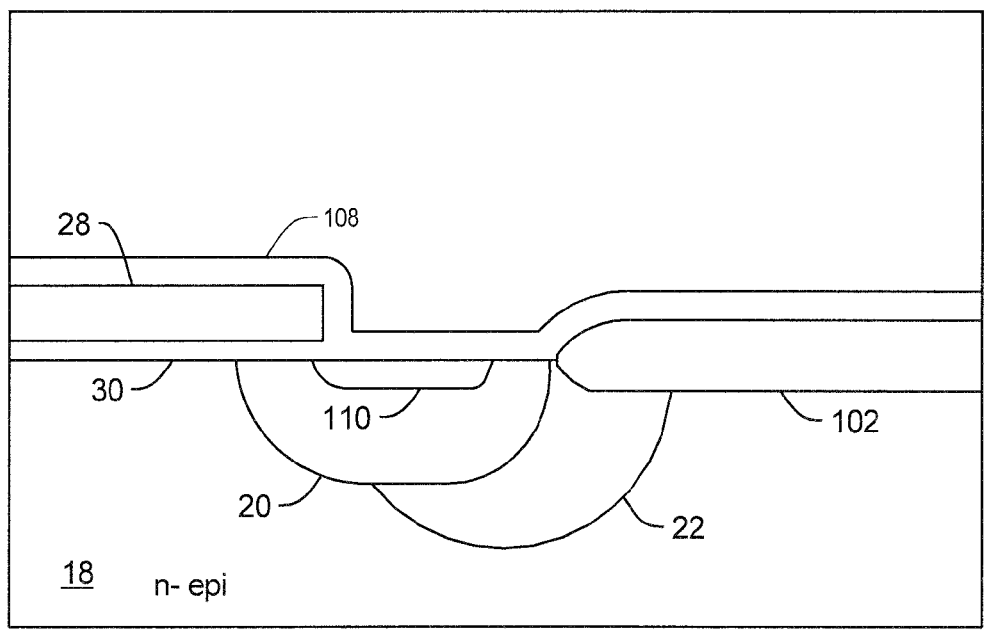
Figure 15C:
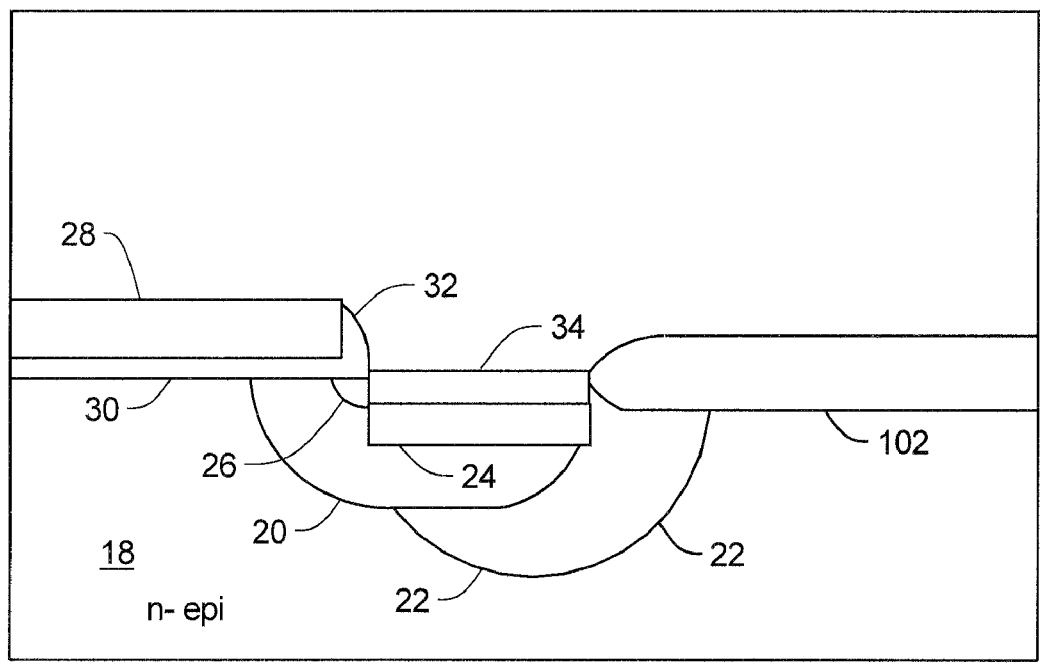

FIGS. 15A, 15B, and 15C show the process steps which may be used to form the cathode region of LIGBT devices 10, 50 and 60. Shown in FIG. 15A is the n− epi layer 18 with a p− well 100 diffused therein. P body 104 and shallow n+ 106 implanted regions are formed self-aligned to the gate poly 28 in the n− epi layer 18. In FIG. 15B the p− well 100, the p body 104 and the n+ implanted region 106 have been diffused out to form the p− well 22, the p body 20 and an n+ layer 110, respectively. After an oxide layer 108 deposition and the deposited oxide is anisotropically etched, the sidewall oxide 32 is left as shown in FIG. 5C. Using the sidewall oxide 32 and the field oxide 102 as a mask, the p+ cathode layer 24 is formed leaving the portion of the n+ layer 110 under the gate 28 and the sidewall oxide 28 in place which is the n+ cathode spacer 26 shown in FIGS. 1A, 1B, 1C, 2, and 6. A portion of the p+ cathode layer 24 is converted to the silicide layer 34. In the preferred embodiment the width of the n+ cathode spacer 26 is on the order of 0.05 to 0.3 μm.

Although the invention has been described in detail with particular reference to certain preferred embodiments thereof, it will be understood that variations and modifications can be effected within the spirit and scope of the invention.

The invention claimed is:

1. A lateral insulated gate bipolar transistor (LIGBT) device, comprising:
   a semiconductor substrate;
   an anode region in said semiconductor substrate;
   a cathode region of a first conductivity type in said substrate laterally spaced from said anode region;
   a cathode region of a second conductivity type in said substrate located proximate to and on a side of said cathode region of said first conductivity type opposite from said anode region;
   a drift region in said semiconductor substrate between said anode region and said cathode region of said first conductivity type;
   an insulated gate operatively coupled to said cathode region of said first conductivity type located on a side of said cathode region of said first conductivity type opposite from said anode region; and an insulating spacer overlying said cathode region of said second conductivity type;

wherein the lateral dimensions of said insulating spacer and said cathode region of said second conductivity type are substantially equal or substantially smaller than the lateral dimension of said cathode region of said first conductivity type.

2. The device of claim 1 wherein said first conductivity type is a p type and said second conductivity type is an n type.

3. The device of claim 1 wherein said lateral dimensions of said cathode region of said second conductivity type arc substantially smaller than the lateral dimension of said cathode of said first conductivity type.

4. The device of claim 1 wherein said anode region includes an anode of said first conductivity.

5. The device of claim 1 wherein said anode region includes interleaved segments of said first conductivity type and of said second conductivity type.

6. The device of claim 1 wherein said anode region includes a Schottky anode.

7. The device of claim 6 wherein said Schottky anode includes a silicide layer and a layer of one of first and second conductivity types.

8. The device of claim 1 wherein said drift region is a super junction drift region.

9. The device of claim 8 wherein said super junction drift region is one of a single JFET (Junction Field Effect Transistor), two stacked JFETs, or multiple JFETs.

10. The device of claim 8 wherein said super junction drift region includes first and second layers of a first conductivity type, a third layer intermediate said first and second layers, said third layer including alternating, interleaved pillars of said first conductivity type and of said second conductivity type extending between said anode and cathode regions.

11. The device of claim 8 wherein said super junction drift region includes first, second, and third layers of a first conductivity type, a fourth layer intermediate said first and second layers, said fourth layer including alternating, interleaved pillars of said first conductivity type and of a second conductivity type extending between said anode and said cathode regions; and wherein said drift region includes a fifth layer intermediate said second and third layers, said fifth layer including alternating, interleaved pillars of said first conductivity type and of a second conductivity type extending between said anode and said cathode regions.

12. A lateral insulated gate bipolar transistor (LIGBT) device, comprising:

a p substrate;

an n region formed on said p substrate;

a p body region formed in said n region;

an anode region;

a p+ cathode region formed in said p body region laterally spaced from said anode region;

an n+ cathode region formed in said p body region located proximate to and on a side of said p+ cathode region opposite from said anode region;

a conductive layer formed on said p+ cathode region and coupled to said n+ cathode region;

a drift region formed on said p substrate between said anode region and said p+ cathode region;

an insulated gate operatively coupled to said p+ cathode region located on a side of said p+ cathode region opposite from said anode region; and an insulating spacer overlying said n+ cathode region;

wherein the lateral dimensions of said insulating spacer and said n+ cathode region are substantially equal or substantially smaller than the lateral dimension of said p+ cathode region.

13. The device of claim 12 wherein said anode region includes an p anode.

14. The device of claim 12 wherein said anode region includes interleaved p and n segments.

15. The device of claim 12 wherein said anode region includes a Schottky anode.

16. The device of claim 15 wherein said Schottky anode includes a silicide layer and an n layer.

17. The device of claim 12 wherein said drift region is a super junction drift region.

18. The device of claim 17 wherein said super junction drift region is one of a single JFET (Junction Field Effect Transistor), two stacked JFETs, or multiple JFETs.

19. The device of claim 17 wherein said super junction drift region includes first and second layers of a first conductivity type, a third layer intermediate said first and second layers, said third later including alternating, interleaved pillars of said first conductivity type and of said second conductivity type extending between said anode and cathode regions.

20. The device of claim 17 wherein said super junction drift region includes first, second, and third layers of a first conductivity type, a fourth layer intermediate said first and second layers, said fourth layer including alternating, interleaved pillars of said first conductivity type and of a second conductivity type extending between said anode and said cathode regions; and wherein said drift region includes a fifth layer intermediate said second and third layers, said fifth layer including alternating, interleaved pillars of said first conductivity type and of a second conductivity type extending between said anode and said cathode regions.

21. The device of claim 1 wherein said device has a deep trench isolation design.

22. The device of claim 1 wherein said device includes a RESURF drift region design.

23. The device of claim 1 wherein said device includes a buried p well region design.

24. The device of claim 12 wherein said device has a deep trench isolation design.

25. The device of claim 12 wherein said device includes a RESURF drift region design.

26. The device of claim 12 wherein said device includes a buried p well region design.

27. A process for making a lateral insulated gate bipolar transistor (LIGBT) device comprising the steps of:

forming an anode region in an active region of a semiconductor substrate;

forming a cathode region of a first conductivity type in said active region laterally spaced from said anode region;

forming a cathode region of a second conductivity type in said active region located proximate to and on a side of said cathode region of said first conductivity type opposite from said anode region;

forming a drift region in said active region between said anode region and said cathode region of said first conductivity type;

forming an insulated gate operatively coupled to said cathode region of said first conductivity type and located on a side of said cathode region of said first conductivity type opposite from said anode region; and forming an insulating spacer overlying said cathode region of said second conductivity type.

* * * * *